United States Patent [19]
Madey et al.
[11] Patent Number: 4,641,103
[45] Date of Patent: Feb. 3, 1987

[54] MICROWAVE ELECTRON GUN

[75] Inventors: John M. J. Madey, 2120 Amherst St., Palo Alto, Calif. 94306; Glen A. Westenskow, Palo Alto, Calif.
[73] Assignee: John M. J. Madey, Palo Alto, Calif.

[21] Appl. No.: 632,757
[22] Filed: Jul. 19, 1984
[51] Int. Cl.[4] ........................ H01J 29/54; H01J 29/58; H01J 29/80; H01J 29/84
[52] U.S. Cl. .................................. 328/228; 315/5.29; 315/5.41; 250/294; 250/305; 328/230; 328/233
[58] Field of Search ...................... 315/1, 3, 4, 5, 5.41, 315/5.42, 5.29; 328/228, 229, 230, 233; 250/194, 305, 294

[56] References Cited

U.S. PATENT DOCUMENTS

| | | | |
|---|---|---|---|
| 2,857,480 | 10/1958 | Mihran et al. | 315/5.41 |
| 3,091,719 | 5/1963 | Dyke et al. | 315/5.41 |
| 3,454,818 | 7/1969 | Soffer et al. | 315/5.41 |
| 3,571,642 | 3/1971 | Westcott | 313/63 |
| 3,916,239 | 10/1975 | Friedlander | 313/460 |
| 4,004,181 | 1/1977 | Kervizic et al. | 315/5.41 |
| 4,090,076 | 5/1978 | Humziker et al. | 250/305 |
| 4,243,916 | 1/1981 | Leboutet et al. | 328/230 |
| 4,284,923 | 8/1981 | Pottier | 315/5.51 |
| 4,329,654 | 5/1982 | Chamberlain | 328/233 |
| 4,346,325 | 8/1982 | Nakasuji et al. | 313/336 |
| 4,412,131 | 10/1983 | Froitzheim | 250/305 |
| 4,414,487 | 11/1983 | Yamashita et al. | 315/5 |
| 4,420,570 | 2/1984 | Takigawa et al. | 250/423 R |
| 4,489,237 | 12/1984 | Litherland et al. | 250/294 |
| 4,527,091 | 7/1985 | Preist | 315/5 |

OTHER PUBLICATIONS

"The Microtron"—S. P. Kapitza et al, Physics Laboratory of the Institute for Physical Problems, Acad. Sciences USSR, Harwood Academic Pub., London-Chur 1978.

*Primary Examiner*—Saxfield Chatmon
*Attorney, Agent, or Firm*—Townsend and Townsend

[57] ABSTRACT

An electron gun (10) that suppresses the non-linear space charge forces and phase-dependant focusing forces that are chiefly responsible for the high emittance of conventional electron guns. The gun comprises a resonant microwave cavity (15), a cathode (12) mounted in the cavity wall, and a momentum analyzer system (17). The resonant microwave cavity, when supplied with microwave power, supports an electromagnetic field having a high-gradient electric component directed along an acceleration axis. The cavity is formed with an exit aperture (32) at a location relative to the cathode such that emitted electrons are accelerated along the axis and pass through the exit aperture. The cavity length is chosen to allow the microwave field within the cavity volume to accelerate the electrons to an energy of about 0.5-1.0 MeV prior to the electrons' passing through the aperture. Bunching is provided by the momentum analyzer. An electron emerging from the cavity has an energy determined by the phase of the microwave field at the time of that electron's emission. Those electrons having energies corresponding to the desired initial phase value are permitted to pass through the momentum analyzer, thereby forming a prebunched electron beam for injection into a linear accelerator.

22 Claims, 8 Drawing Figures

MICROWAVE ELECTRON GUN

The Government has rights in this invention pursuant to Contract No. N00014-78-C-0403 awarded by the Office of Naval Research.

FIELD OF THE INVENTION

The present invention relates generally to electron devices, and more specifically to a gun for providing an electron beam suitable for injection into a linear accelerator.

BACKGROUND OF THE INVENTION

High current, low emittance electron beams are required for a number of applications in scientific research, technology, and medicine. Applications such as nuclear physics, radiography, radiotherapy, and laser technology require electron beams with energies of 10–100 MeV, instantaneous peak currents of 10–100 amperes, and normalized current densities in excess of $1\times10^6$ amp/cm$^2$. Electron linear accelerators are in principle capable of providing such beams, but the beam quality is typically limited by space charge and phase-dependent focusing forces in the electron gun that injects the electrons into the accelerator waveguide.

The most common type of electron gun suitable for use with a linear accelerator subjects electrons emitted from a thermionic cathode to a DC electric field for initial acceleration, and then passes the electrons through a longitudinal microwave electric field to provide a bunched beam suitable for injection into the accelerator. Typical electron guns are designed to provide electron energies on the order of 100 keV.

In conventional DC guns, the electrons are subject to non-linear space charge forces which increase the emittance. These space charge forces result from non-uniformities in the charge density of the beam. More particularly, where the charge density is a function of radius or azimuth, the electrons are subject to non-linear defocusing forces which increase the apparent beam radius and angular divergence, and hence the emittance. While it is in principle possible to minimize the emittance growth due to space charge by suitably shaping the electrodes surrounding the cathode, such a technique depends on uniform emission from the cathode. In practice, the emission is never uniform, and the electrode configuration can provide only a partial and imperfect correction to the space-charge induced emittance growth.

It is possible to reduce such space charge forces by operating the gun at a higher accelerating DC field to increase the electrons' energy. However, for pulsed or DC fields greater than about 100 kv/cm, electron (and possibly ion) emission from the electrodes and insulating elements grows rapidly, leading to internal arcs.

Conventional DC guns also subject the electrons to phase-dependant focusing forces which further increase the emittance. As alluded to above, the DC electron beam must be velocity modulated by passage through a buncher cavity to form the bunched structure required for injection into the linear accelerator. However, the longitudinal accelerating field in the bunching cavity generates an azimuthal magnetic field which focuses or defocuses the electrons, depending on the phase at which they pass through the cavity. Such focusing force typically reaches its maximum value as the longitudinal electric field passes through zero. Thus, electrons entering the bunching cavity in a continuous stream exit with a range of transverse momenta corresponding to their initial radial displacement and their phase at the time of passage through the cavity. For a randomly-phased initial electron beam, the range of transverse momenta induced by the microwave field increases the spread in divergence angles of the electrons in the beam, and hence the emittance.

The two-mile accelerator at the Stanford Linear Accelerator Center ("SLAC"), Stanford, Calif., is an example of a machine whose beam is characterized by high emittance caused by the inherent properties of the electron gun system. Until recently, the high emittance did not impose a fundamental constraint on the research program, since there was no need to focus the electron beam to an extremely small spot. However, the beam properties have been found unsuitable for the linear collider program now underway at SLAC. The solution developed at SLAC is based on the use of synchrotron radiation damping in a specially designed storage ring. The electron beam is extracted from the main beam line at an energy of 1 GeV, injected into the storage ring where it is allowed to circulate for about 10 milliseconds, and re-injected into the accelerator for acceleration to the final energy. The synchrotron radiation emitted by the electrons in the storage ring monochromatizes the beam and reduces its transverse dimensions, thereby making the beam suitable for use in the linear collider. Unfortunately, the cost of this solution to the beam emittance problem is estimated to be about $15,000,000.

Thus, existing gun technology is ill-suited to produce low emittance, high current electron beams due to the non-linear space charge forces and phase-dependent focusing forces which are intrinsic to their operation. Moreover, even where the existing electron gun and buncher cavity technology is satisfactory, the power supplies, microwave cavities, and focusing magnets required for the operation of such systems are large and expensive, and reduce the overall reliability of the system.

SUMMARY OF THE INVENTION

The present invention provides an electron gun that suppresses the non-linear space charge forces and phase-dependant focusing forces that are chiefly responsible for the high emittance of conventional electron guns. The gun of the present invention produces electrons at high currents and current densities, and is characterized by high reliability and relatively low cost.

To put the cost saving of the present invention in perspective, for the example of SLAC's linear collider program, had the gun of the present invention been used for the electron beam, it would have eliminated the need for the storage ring that is used to cool the beam. The cost of the gun is estimated to be approximately two orders of magnitude lower than the cost of the storage ring system.

Broadly, the present invention subjects the electrons emitted from a thermionic cathode to an intense microwave electric field for acceleration, and then blocks all but a narrow range of momentum to provide the bunching required by the linear accelerator. Accordingly, the gun comprises a resonant microwave cavity, a cathode mounted in the cavity wall, and a momentum analyzer system.

The resonant microwave cavity, when supplied with microwave power, supports an electromagnetic field having a high-gradient electric component directed along an acceleration axis. The cavity is formed with an exit aperture at a location relative to the cathode such that emitted electrons are accelerated along the axis and pass through the exit aperture. The cavity length is chosen to allow the microwave field within the cavity volume to accelerate the electrons to an energy of about 0.5–1.0 MeV prior to the electrons' passing through the aperture. The internal surface of the cavity adjacent the cathode is contoured in a manner similar to that used in DC electron guns to counteract the non-linear space charge force encountered by the electrons as they are accelerated to relativistic velocities from their initial thermal velocities at the cathode surface. The internal surface of the cavity near the cathode and exit aperture may also be contoured to maximize the microwave electric field at the cathode.

Bunching is provided by the momentum analyzer which comprises a dispersive magnet and a slit. An electron emerging from the cavity has an energy determined by the phase of the microwave field at the time of that electron's emission. The magnet causes electrons with different energies to follow different trajectories, while the slit is disposed to block those electrons having energies outside a desired narrow range. Thus, only those electrons having energies corresponding to the desired initial phase value are permitted to pass through the momentum analyzer, thereby forming a pre-bunched electron beam for injection into a linear accelerator. The time dispersion of the momentum analyzer system may be chosen to compress the electron beam in time to secure the bunch length appropriate for acceleration by the linear accelerator.

The present invention overcomes the limitations imposed on conventional electron guns by space charge forces and phase-dependant RF focusing forces by allowing acceleration to considerably higher energies. Properly designed and fabricated resonant microwave cavities can provide electric field gradients on the order of $10^6$ volts/cm, a factor of 10 higher than those for conventional DC guns. Since space charge forces scale as $(1/\beta\gamma)^2$ due to the cancellation of the electrostatic forces in relativistic electron beams, the factor of 10 increase in accelerating field provides a reduction in space charge forces by a factor of 100. This reduction in the overall space charge force also reduces the non-linear component of the force, and hence the emittance growth caused by the non-linear component.

The present invention also suppresses phasedependant focusing forces. Since the momentum analyzer provides, in effect, a selection on the basis of electron phase, the radial focusing forces acting on these selected electrons during their acceleration in the cavity is limited to a small range of variation. While the electrons that are later selected by the momentum analyzer are still focused (or defocused) by the microwave field in the accelerating cavity of the gun, the focusing action for the selected electrons is nearly constant, and thus does not alter the emittance of the beam.

A better understanding of the nature and advantages of the present invention may be realized by reference to the remaining portions of the specification and attached drawings.

DESCRIPTION OF THE PREFERRED EMBODIMENTS

System Overview

Figure 1:
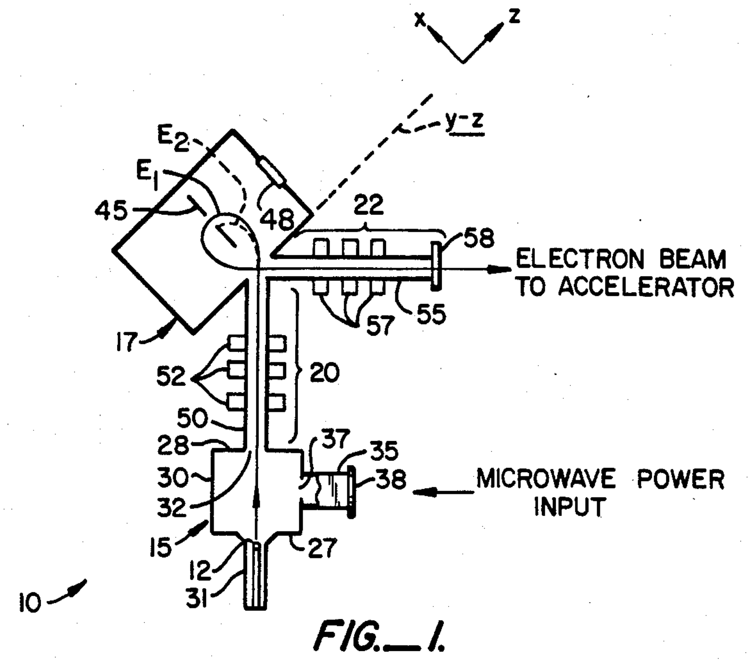
FIG. 1 is a schematic top plan view of the electron gun of the present invention.
Figure 2:
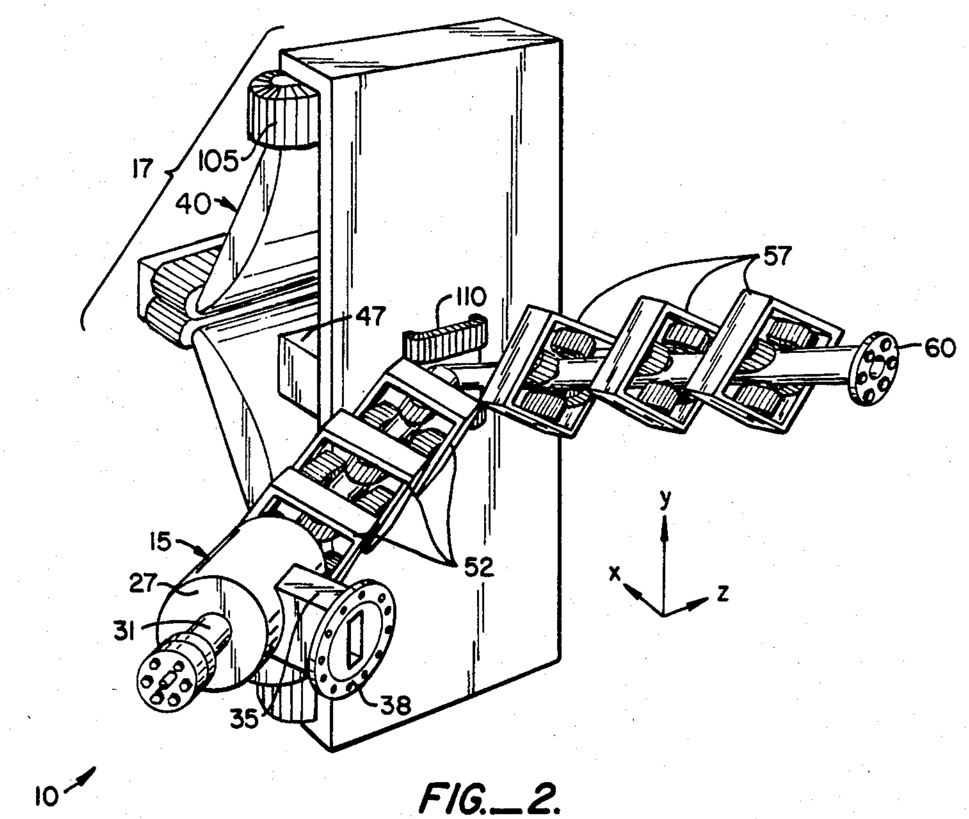
FIG. 2 is an isometric view of the electron gun.

FIGS. 1 and 2 are schematic top plan and isometric views of an electron gun 10 for use with a linear accelerator (not shown). In the broadest terms, the invention comprises a thermionic cathode 12, a resonant microwave cavity 15, a momentum analyzing system 17, and a beam transport system. The beam transport system includes a first segment 20 between cavity 15 and momentum analyzer 17, and a second segment 22 between momentum analyzer 17 and the linear accelerator.

Cavity 15 is cylindrical, having opposed end walls 27 and 28, and a peripheral side wall 30. Cathode 12 is mounted generally centrally along end wall 27 on a supporting structure 31. End wall 28 is formed with a central exit aperture 32 in communication with beam transport segment 20. A waveguide 35 communicates with the cavity interior through a coupling iris defining an inlet port 37, and couples to a source of microwave power by a standard waveguide flange 38. Momentum analyzer 17 includes a magnet 40 and a slit 45 located within an evacuated chamber 47 in the magnetic field region. Chamber 47 is provided with a viewing port 48.

Magnet 40 is configured to cause an electron entering momentum analyzer 17 to undergo approximately 270° of deflection prior to exiting the momentum analyzer. The trajectory of an electron of a first energy $E_1$ is shown as a solid line, that of a second (lower) energy $E_2$ as a broken line. Momentum analyzing slit 45 is shown allowing the electron of energy $E_1$ to pass while blocking the electron of energy $E_2$.

Beam transport segment 20 includes a beam pipe 50 and a series of quadrupole focusing magnets 52. Beam transport segment 22 includes a beam pipe 55 and a series of quadrupole focusing magnets 57. Magnets 52 and 57 are also provided with windings that provide a dipole field to permit beam steering. Alternately, solenoid focusing magnets and separate steering magnets could be used. Beam pipe 55 terminates in a vacuum flange 58 for coupling gun 10 to the linear accelerator vacuum system.

In operation, electrons are emitted by cathode 12, are accelerated by the microwave field in cavity 15, pass through exit aperture 32, pass through beam pipe 50, and enter momentum analyzer 17. Those electrons having energies in a particular energy range pass through beam pipe 55 and are injected into the linear accelerator.

Microwave Cavity

Figure 3:
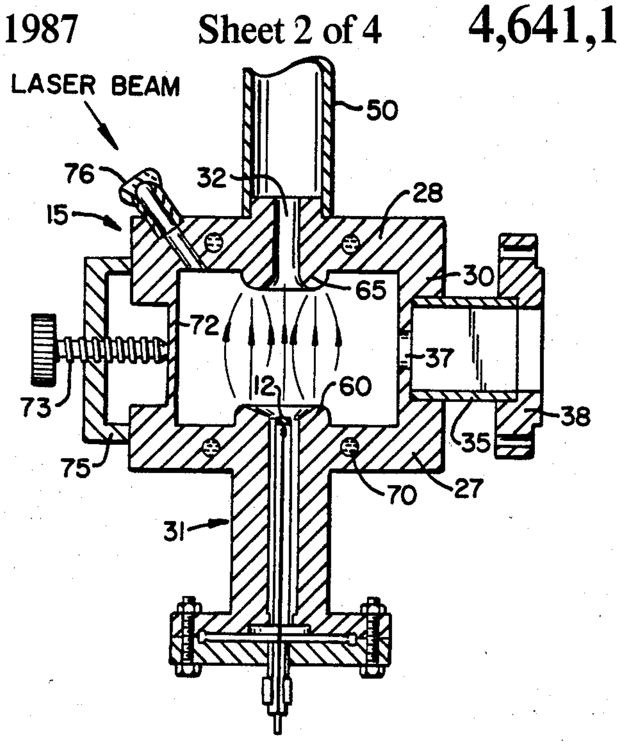
FIG. 3 is a cross-sectional view of the microwave cavity.

FIG. 3 is a cross-sectional view of microwave cavity 15 taken along a diametric plane that bisects waveguide 35. Cavity 15 is preferably a $TM_{010}$ cavity that supports a microwave field having an electric component directed along the cylinder axis. As is well known, for a $TM_{010}$ cavity, the resonant frequency depends on the radius but not the axial length, with the wavelength λ being related to the radius R by the equation $$\lambda = 2.61\ R$$

The axial length is preferably less than one-half the wavelength to reduce the number of electrons that are emitted from cathode 12, accelerated toward exit aperture 32, and then accelerated back into cathode 12 when the microwave field reverses. The microwave frequency will normally be in the range of 1–10 GHz (wavelength in the range of 3–30 cm). The microwave frequency should be set equal to the operating frequency of the linear accelerator, or to a subharmonic of that frequency.

End wall 27 carries an inwardly extending, generally toroidal nosepiece 60 surrounding cathode 12. End wall 28 carries a toroidal nosepiece 65 surrounding exit aperture 32. Nosepiece 60 is shaped to define a generally frustoconical surface surrounding cathode 12, with a cone angle of approximately 120°. The shaping of nosepiece 60 conforms to known practice as used in conventional DC guns and described in J. R. Pierce, "Traveling Wave Tubes" (D. Van Nostrand, New York 1950). A nosepiece of this configuration shapes the electric field surrounding cathode 12 in a manner that minimizes the space-charge induced emittance growth of the electrons that are emitted from the cathode. Nosepieces 60 and 65 also have the effect of increasing the electric field to which the electrons are subjected. While such nosepieces would not affect the final electron energy in a DC gun, the effect in the microwave gun of the present invention is to increase the electron energy.

Cavity 15 is preferably constructed of stainless steel, following machining practices that have been developed in the field of high voltage microwave devices. For example, the inner cavity surfaces should be as smooth as possible, but the machining should be done without cutting oil. Additionally, the surface should not be polished after machining, since abrasive particles left in the surface would increase the secondary emission characteristics of the surface, possibly leading to arcing and breakdown. End walls 27 and 28 are formed with internal passage-ways 70 through which cooling water may be circulated to dissipate the heat generated by electrons hitting the end walls.

Cavity 15 is matched to the microwave source that supplies the microwave energy through waveguide 35, taking into account the real and reactive components of the beam loading provided by the electron beam. The nominal real component of the beam loading is matched by appropriately sizing inlet port 37 in the coupling iris. The reactive component of the beam loading is matched by a mechanism for shifting the resonant frequency of the cavity. To this end, sidewall 30 is formed with a thin portion (say 20–50 mils) to define a flexible diaphragm 72. A lead screw 73 is threaded in a yoke 75 mounted to the rigid portions of the cavity to allow deformation of diaphragm 72.

End wall 28 may be provided with a window 76 that permits cathode 12 to be illuminated during the particular phase interval of interest, thereby increasing the electron current. A tripled, mode-locked Nd:YAG laser provides a beam of ultraviolet light of sufficient intensity to increase significantly the current obtainable from the cathode. The enhanced emission secured by this technique can be exploited either to increase the net current available from the gun, or to reduce the cathode temperature required for operation, thereby increasing the cathode lifetime.

Cathode and Cathode Mounting

Figure 4A:
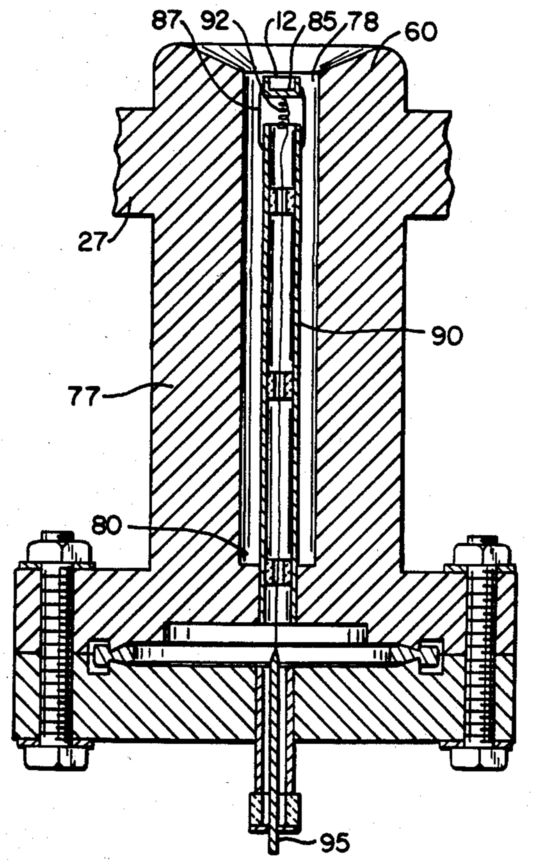
FIG. 4A is a cross-sectional view of one embodiment of the cathode and cathode mounting.

FIG. 4A is a cross-sectional view illustrating the construction of cathode 12 and cathode mounting structure 31. Mounting structure 31 positions cathode 12 at a location along cavity wall 27 in a manner that provides thermal isolation while maintaining cathode 12 at the same RF voltage as the cavity wall. Accordingly, end wall 27 carries a half-wavelength coaxial transmission line ("stub") 77 extending axially outward from a first (cavity) end 78 at the cavity wall to a second (termination) end 80 at which the stub is shorted. Cathode 12 is physically located at cavity end 78, but the mounting is at termination end 80.

Cathode 12 is a cylindrical crystal of lanthanum hexaboride or other refractory thermionic emitter within a refractory metal cup 85. A short cylinder 87 of molybdenum or other refractory metal foil is spot welded to cup 85 and to a hollow stainless steel cylinder 90. Cylinder 90, which forms the inner conductor of the stub, is physically and electrically connected to the cavity wall at termination end 80. Molybdenum foil cylinder 87 is thin enough to provide thermal isolation of cathode 12 from stainless steel cylinder 90, and is short enough to maintain adequate mechanical strength. Cathode 12 is heated by a heating filament 92 which is located inside foil cylinder 87 and receives power via a feedthrough 95. The filament power requirement is defined by the cathode operating temperature and the degree of thermal isolation. Typical filament power levels are in the range of 5–30 watts.

Figure 4B:
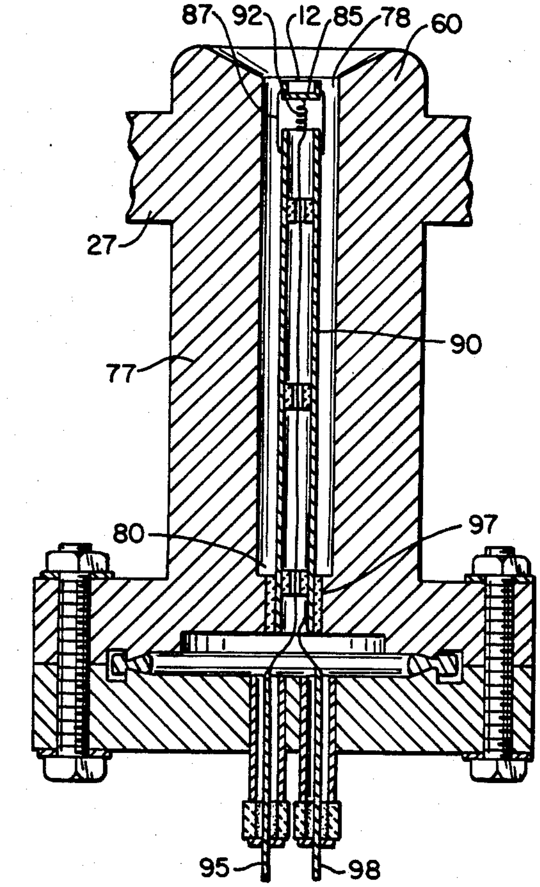
FIG. 4B is a cross-section view of a second embodiment of the cathode and cathode mounting.

FIG. 4B shows an alternate construction that allows cathode 12 to be biased at a DC potential relative to the cavity walls. This construction differs from that in FIG. 4A in two respects. First, stainless steel cylinder 90 is insulated from the mounting structure by an annular insulator 97. Second, an additional feedthrough 98 is provided for coupling a source of DC potential to cylinder 90 (and therefore also to cathode 12). Insulator 97 is preferably ceramic having as high a dielectric constant as possible so that it appears as a short circuit at microwave frequencies.

Application of a relatively low voltage DC bias (100–1000 volts) to cathode 12 allows the optimization of the emittance of the electrons obtained from the gun by compensating for small errors in the contour of nosepiece 60 or for non-uniformities in cathode emission which may develop during the course of operation.

Momentum Analyzer

Figure 5:
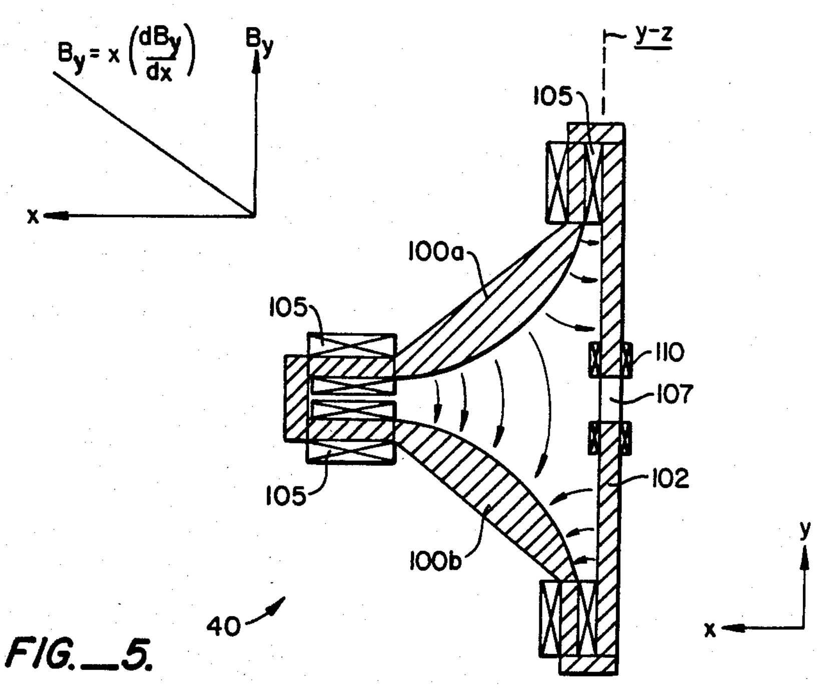
FIG. 5 is a cross-sectional view of the momentum analyzer magnet.

FIG. 5 is a cross-sectional view of momentum analyzer magnet 40 (also shown in FIG. 2). The field of magnet 40 can best be described with respect to a coordinate system where beam tubes 50 and 55 are in the x-z plane and at 45° to the y-z plane. The electron trajectories are in the x-z plane, with the deflection being imparted by the y-component of the field. The y-component has a magnitude that varies linearly with the x coordinate, i.e., with the distance from the y-z plane. The preferred magnet configuration for producing such a field is, in effect, a diagonally cut quadrupole having soft iron hyperbolic pole faces 100*a* and 100*b*, a soft iron front plate 102, and suitable field coils 105. Field coils 105, when energized, provide the desired magnetic field. Front plate 102 is formed with a slot 107 to accommodate the beam pipes where they enter chamber 47.

This type of magnet, known as an "α-magnet," causes electrons to follow trajectories shaped like the Greek letter "alpha." In theory, the orbits are characterized by a total deflection of about 274°. However, it is convenient to have beam pipes 50 and 55 at 90° to one another, which requires a total deflection of 270°. Since slot 107 in front plate 102 causes departures from the ideal case in any event, additional coils 110 are provided above and below the slot opening to establish a localized field in the slot region and thus allow fine tuning of the deflection.

Figure 6:
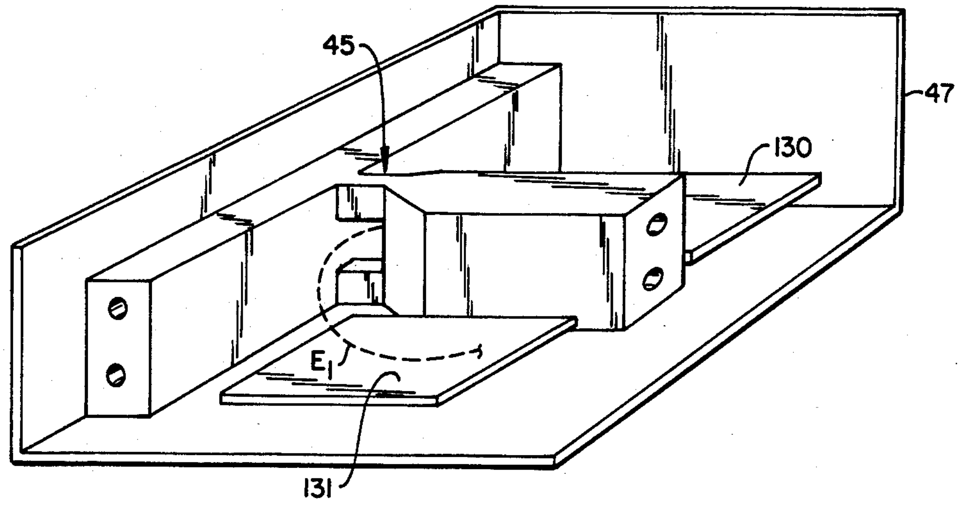
FIG. 6 is an oblique view of the momentum analyzing slit and deflection plate.

FIG. 6 is an oblique view of momentum analyzing slit 45 with three of the six walls of chamber 47 cut away to reveal the slit structure. The slit is sized relative to the transverse scale of the electron trajectories to allow only electrons having momenta in a narrow range to pass. The range of momenta preferably corresponds to a phase interval of a few to several degrees, say 2°-10°. Since most of the electrons are meant to be blocked by slit 45, the slit structure is provided with internal passageways for cooling water to dissipate the heat.

The momentum analyzer is also provided with a deflecting electrode plate 130 to gate the electron beam so that all electrons, regardless of energy, may be prevented from passing through the system except at specific times. When a high potential is applied to plate 130, the incoming electrons are deflected from their path through the jaws of analyzing slit 45, and are stopped by the walls of the slit. When the potential is removed, the electrons resume their nominal trajectories through the slit. The need for gating the beam is imposed by the linear accelerator, satisfactory operation of which requires that the injection of the electrons into the accelerating cavities not be commenced until the accelerating field has reached its final value, and that injection be ceased before the accelerating field has begun to decay. The deflecting voltage, typically 1-10 kv, may be switched using a high-speed thyratron of the type used in conventional pulsed gun technology.

It is noted that a second deflection plate 131 may be added at the output side of the slit to reduce the complexity of the high voltage switching circuit required to drive the plates. Ordinarily, fast rise-time voltage pulses are most easily generated by shorting a high impedance load either to ground or to a low impedance high voltage power supply. The rise time in such a circuit is determined by the switching impedance and the capacitance of the load, and would range on the order of 0.1-1.0 microseconds for the capacitor plates of the invention. But the fall time of such a circuit is determined by the high impedance of the load. In practice, achievement of fall times below 1 microsecond is often difficult for a high voltage switch. If the first deflect plate 130 is maintained at high potential to block the passage of the electron beam through the slit until the accelerating cavities have been filled, while the second plate 131 is maintained initially at ground, plate 130 needs only to be shunted to ground to permit injection of the electron into the accelerator. The electron beam can then be cut off by shorting the second plate 131 to the high voltage power supply, deflecting the electron beam out of the beam line into the walls of momentum analyzer vacuum chamber 47, or some succeeding downstream component of the system.

Operation

In view of the above description of the structure of the present invention, the operation and the characteristics will now be described.

Cathode 12 is heated by filament 92, preferably to a temperature in the range of 1400°-2000° C. The current density J obtainable from such a cathode is given by Richardson's equation as follows:

$$J = 73\ T^2 \exp\left[(-e\phi + e\sqrt{eE}\ )/kT\right] \text{ amp/cm}$$

where $e$ = electron charge (stat-coulombs)
= $4.8 \times 10^{-10}$ stat-coulombs
$E$ = electric field strengths (stat-volts/cm)
$e\Phi$ = electron work function (ergs)
$k$ = Boltzmann's constant
= $1.38 \times 10^{-16}$ ergs/°K.
$T$ = cathode temperature (°K.)

At a temperature of 1600° C. and a field of 400 kv/cm, this equation indicates that a current density of 560 amp/cm$^2$ can be obtained from (110) face of lanthanum hexaboride which has a work function $e\Phi = 2.6$ electron volts.

It is noted that the peak current in a microwave gun is comparable to the average current emitted from the cathode since the bunching is accomplished by removing electrons having the undesired phases. This is in contrast to a conventional DC gun where the bunching process raises the peak current by shifting the phase of electrons to concentrate them in bunches. Accordingly, in order to maintain a peak current that is comparable to that provided by conventional guns, the cathode used in the gun of the present invention must be operable at a higher current density than is typical for conventional DC guns. The high current densities obtainable using a high temperature lanthanum hexaboride cathode satisfies this requirement. It is noted that the average cathode current density can be reduced if photoemission is used to boost the current during the phase range accepted by the momentum analyzer system.

Microwave energy is transmitted to cavity 15, and may be supplied by using a directional coupler to extract a few megawatts power from the main waveguide supplying power to the linear accelerator. Regardless of the source of power, a standing wave with an electric field component of about 200 kv/cm or more is established in cavity 15. The field amplitude scales as the square root of the power, with the maximum being determined by the breakdown characteristics of cavity 15. It has been shown that field gradients in excess of 2 megavolt/cm may be obtained in well-prepared S-band microwave cavities. Eiji Tanabe, "Voltage Breakdown in S-band Linear Accelerator Cavities," IEEE Trans. Nucl. Sci., NS-30 (4), 3351 (1983).

The effect is to accelerate the electrons emitted from cathode 12, although the energy of a given electron on reaching exit aperture 27 depends upon the phase of the RF field at the time of emission of that electron.

Figure 7:
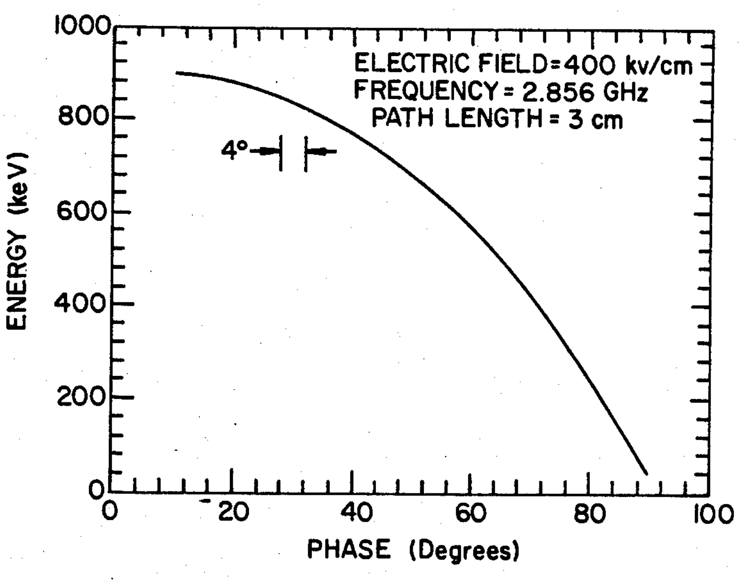
FIG. 7 is a plot of electron energy versus phase for a particular set of conditions.

FIG. 7 is a plot of electron energy versus phase for the particular conditions where the electric field is 400 kv/cm, the frequency is 2.856 GHz, and the path length is 3 cm. Zero phase is defined as the phase at which the electric field is at zero and beginning to increase in the direction of acceleration. Thus, it may be seen that the electrons emerging from the cavity have a large spread in energy, ranging from the maximum value of almost 1 MeV down to 0. However, since the spread in energy corresponds unambiguously to the spread in phase, a restriction on the range of energy (or equivalently, momentum) provides electrons having a narrow range of phase. Thus; the momentum analyzer system the present invention provides a bunched electron beam for injection into the linear accelerator. The 4° interval shown in the plot corresponds to those electrons having energies between 828 and 849 keV.

The characteristic time dispersion properties of magnet 40 allow it to modify the bunch length. More particularly, the physical length of the electron bunch from the system depends on the range of initial phases selected by the momentum analyzer 17 and on the time dispersion introduced by the momentum analyzer and the transport system. In a drifting electron beam, high energy electrons travel faster than low energy electrons so that the bunch length tends to grow with time. However, the α-magnet introduces the opposite dispersion since the high energy electrons travel longer paths and hence take a longer time to pass through the momentum analyzer. Therefore, the dispersion within the momentum analyzer acts to cancel the dispersion introduced by the drift spaces in the transport system. Thus, the net time dispersion depends on the net length of the drift spaces and the length of the trajectory in the α-magnet. By selecting the magnetic field strength in the α-magnet, and hence the trajectory length in the α-magnet, the net dispersion can be set to zero, at which value the length of the bunch injected into the accelerator matches the spread in phase over which the electrons initially were extracted from the cathode. Alternately, the net dispersion can be set to expand or compress the length of the bunch. In the preferred embodiment, the net dispersion is set to minimize the bunch length at the input to the linear accelerator. This minimizes the energy spread of the accelerated electrons.

Conclusion

In summary it can be seen that the present invention, by operating at very high electric fields, eliminates or suppresses the charge space charge forces, and by selecting only a narrow range of phases for injection into the linear accelerator, eliminates or suppresses phase-dependent focusing forces. The use of the negative dispersion α-magnet system further allows the electron bunch length to be compressed to minimize the energy spread of the accelerated electrons.

While the above is a full and complete description of the present invention, alternate constructions, modifications, and equivalents may be employed without departing from the spirit of the invention. For example, the cathode mounting in FIG. 4B allows a DC bias to be applied to the cathode to enhance the accelerating characteristics of the microwave cavity. Indeed, the bunching characteristics of the invention could be applied to more conventional DC gun technology by superimposing a relatively small microwave field component on the DC field used in that technology. Thus, a 20-kv RF voltage could be superimposed on a 100-kv DC voltage to provide a beam having an energy spread modulated at to the phase of the microwave field. The momentum analyzing system could then be used to select the phases to be injected into the subsequent accelerating structure. Additionally, while the stub length and cathode position are shown as fixed, a sliding short could be provided to adjust the stub length. Therefore, the above description and illustrations should not be taken as limiting the scope of the invention which is defined by the appended claims.

What is claimed is:

1. An electron gun comprising:

a thermionic cathode

RF cavity means defining an internal volume for supporting an electromagnetic field having a high-gradient electric component within said volume, said RF cavity means having first and second wall portions, said wall portions being separate from each other, said second wall portion being formed with an exit aperture; and means for mounting said cathode at a position proximate said first wall portion such that electrons emitted from said cathode enter said volume and are subjected to said electric field component and accelerated thereby so as to pass through said exit aperture;

said means for mounting being operable to maintain said cathode at substantially the same RF voltage as said first wall portion and to provide thermal isolation between said cathode and said first wall portion.

2. The electron gun of claim 1 wherein aid RF cavity means is a $TM_{010}$ mode microwave cavity.

3. The electron gun of claim 1 herein said cathode comprises:

a body of refractory material; and means for heating said body of refractory material to a sufficiently high temperature that thermionic emission occurs.

4. The electron gun of claim 3 wherein said refractory material is lanthanum hexaboride.

5. The electron gun of claim 1 wherein said means for mounting comprises:

means defining a half-wavelength stub in communication with said volume defined by said RF cavity means, said stub extending from a cavity end at said first wall portion to a termination end; and means for mechanically connecting said cathode to said stub at said termination end such that said cathode is located at said cavity end, whereupon said cathode remains at substantially the same RF voltage as said first wall portion while being thermally insulated therefrom.

6. The electron gun of claim 1, and further comprising momentum analyzer means disposed in the path of the electrons emerging from said RF cavity means for defining a range of electron mementum and for blocking the passage of electrons having momenta outside said range.

7. The invention of claim 6 wherein said momentum analyzer means comprises:

means for dispersing the electrons emerging from said RF cavity means in transverse position according to their momenta; and means defining an analyzing slit in the path of the electrons, so dispersed, for blocking the passage of electrons having transverse coordinates outside a range corresponding to said range of electron momentum.

8. The electron gun of claim 1, and further comprising:

gating means for blocking the passage of electrons during a predetermined time interval.

9. The electron gun of claim 8 wherein said gating means comprises:

means for applying a pulsed deflecting field to the electrons emerging from said RF cavity means.

10. A method of producing a bunched beam suitable for injection into a linear accelerator, comprising the steps of:

providing a generally continuous stream of electrons at energies in the range of a few to several electron volts;

subjecting the stream of electrons to a microwave field in a region, the microwave field having a high electric component along an axis to accelerate the electrons along the axis, whereupon a given electron, upon leaving the region of high electric field, has an energy corresponding to the phase in the microwave field at which the electron entered the region; and selecting electrons in the stream, so accelerated, having a range of energies corresponding to a desired range of phase.

11. The method of claim 10 wherein said providing step entails thermionic emission of eletrons from a heated cathode.

12. An electron gun comprising:

cathode means for emitting electrons cavity means defining an internal volume for supporting an electromagnetic field having a high-gradient electric component within said volume, said cavity means having portions defining an exit aperture;

means for mounting said cathode means at a position relative to said cavity means such that electrons emitted from said cathode means enter said volume and are subjected to said electric field component and accelerated thereby so as to pass through said exit aperture; and momentum analyzer means disposed in the path of the electrons emerging from said cavity means for defining a range of electron momentum and for blocking the passage of electrons having momenta outside said range.

13. The electron gun of claim 12 wherein said cavity means is a $TM_{010}$ mode microwave cavity.

14. The electron gun of claim 12 wherein said cathode means comprises:

a body of refractory material; and means for heating said body of refractory material to a sufficiently high temperature that thermionic emission occurs.

15. The electron gun of claim 12 wherein said refractory material is lanthanum hexaboride.

16. The electron gun of claim 12 wherein said means for mounting comprises:

means defining a half-wavelength stub in communication with said volume defined by said resonant cavity means, said stub extending from a cavity end to a termination end; and means for mechanically connecting said cathode means to said stub at said termination end such that said cathode means is located at said cavity end whereupon said cathode means remains at substantially the same RF voltage as said cavity means while being thermally insulated therefrom.

17. The electron gun of claim 12 wherein said momentum analyzer means comprises:

means for dispersing the electrons emerging from said cavity means in transverse position according to their momenta; and means defining an analyzing slit in the path of the electrons, so dispersed, for blocking the passage of electrons having transverse coordinates outside a range corresponding to said range of electron momentum.

18. The electron gun of claim 12 wherein said momentum analyzer means has a characteristic time dispersion such that faster electrons are forced to travel over a longer path than slower electrons.

19. The electron gun of claim 12 wherein said momentum analyzer means comprises an alpha-magnet, which causes electrons to undergo about 270° of deflection, with faster electrons traveling over longer paths than slower electrons.

20. The electron gun of claim 12, and further comprising:

gating means for blocking the passage of electrons during a predetermined time interval.

21. The electron gun of claim 20 wherein said gating means comprises:

means for applying a pulsed deflecting field to the electrons emerging from said cavity means.

22. A method of producing a bunched beam suitable for injection into a linear accelerator, comprising the steps of:

providing a generally continuous stream of thermionically emitted electrons at energies in the range of a few to several electron volts;

subjecting the stream of electrons to a microwave field in a region, the microwave field having an electric component of at least about 200 kv/cm along an axis to accelerate the electrons along the axis, whereupon a given electron, upon leaving the region of high electric field, has an energy corresponding to the phase in the microwave field at which the electron entered the region; and selecting electrons in the stream, so accelerated, having a range of energies corresponding to a desired range of phase.

* * * * *

UNITED STATES PATENT AND TRADEMARK OFFICE
CERTIFICATE OF CORRECTION

PATENT NO. : 4,641,103

DATED : February 3, 1987

INVENTOR(S) : John M.J. Madey, ēt al

It is certified that error appears in the above-identified patent and that said Letters Patent is hereby corrected as shown below:

Col. 9, line 68, a semicolon (;) should appear after "cathode".

Col. 10, line 19, "aid" should read --said--.

Col. 10, line 22, "herein" should read --wherein--.

Col. 10, line 45, "mementum" should read --momentum--.

Col. 11, line 16, "eletrons" should read --electrons--.

Col. 11, line 19, a semicolon (;) should appear after "electrons".

Col. 11, line 19, a new paragraph should begin with the word "cavity".

Signed and Sealed this

Twenty-eighth Day of April, 1987

*Attest:*

DONALD J. QUIGG

*Attesting Officer*

*Commissioner of Patents and Trademarks*